United States Patent
Broberg et al.

(10) Patent No.: US 11,772,791 B2
(45) Date of Patent: Oct. 3, 2023

(54) UNMANNED AERIAL VEHICLE TETHER SYSTEM

(71) Applicant: Unmanned Systems and Solutions, LLC, Hinsdale, IL (US)

(72) Inventors: Chris Broberg, Tampa, FL (US); Manuel Lago, Tampa, FL (US); Ted Kempgens, Riverview, FL (US); Paul Corry, Oakville (CA)

(73) Assignee: Unmanned Systems and Solutions, LLC, Hinsdale, IL (US)

( * ) Notice: Subject to any disclaimer, the term of this patent is extended or adjusted under 35 U.S.C. 154(b) by 1154 days.

(21) Appl. No.: 16/353,720

(22) Filed: Mar. 14, 2019

(65) Prior Publication Data
US 2019/0283869 A1   Sep. 19, 2019

Related U.S. Application Data

(60) Provisional application No. 62/643,720, filed on Mar. 15, 2018.

(51) Int. Cl.
*B64C 39/02* (2023.01)
*H02G 11/02* (2006.01)
(Continued)

(52) U.S. Cl.
CPC .......... *B64C 39/022* (2013.01); *B64C 39/024* (2013.01); *B64F 3/02* (2013.01);
(Continued)

(58) Field of Classification Search
CPC ............... B64C 39/022; B64C 39/024; B64C 2201/148; B64C 2201/027;
(Continued)

(56) References Cited

U.S. PATENT DOCUMENTS

| 1,973,446 A | 9/1934 | Rosenquist |
| 4,923,135 A | 5/1990 | Schabmüller |

(Continued)

FOREIGN PATENT DOCUMENTS

| GB | 2537218 A | * | 10/2016 | ........... H01L 23/145 |
| JP | 2017194522 A | | 10/2017 | |

(Continued)

OTHER PUBLICATIONS

International Search Report dated Jul. 9, 2019. Applicant: Unmanned Systems and Solutions, LLC, PCT application No. PCT/US19/22318 filed on Mar. 14, 2019.

(Continued)

*Primary Examiner* — Elim Ortiz
(74) *Attorney, Agent, or Firm* — Shumaker, Loop & Kendrick, LLP; Jeffrey B. Fabian

(57) ABSTRACT

UAV tether systems are provided that reliably deploy and retract cables capable of high-power and high-bandwidth data transmission. The tether system spools cables in a single layer to promote heat dissipation thereby allowing the use of lower-diameter cables. The tether systems further utilize a lightweight converter that achieves a high-voltage power transmission across a cable that is stepped down to a plurality of lower-voltage outputs usable by a UAV and (Continued)

accompanying payloads. The converter is constructed in a manner that promotes heat dissipation through the use of multi-layer PCBs and separate power modules PCBs mounted above main PCBs to create a cavity where forced air can reach heat sinks affixed to the power modules that extend into the cavity.

9 Claims, 17 Drawing Sheets

(51) Int. Cl.
| | |
|---|---|
| H02J 9/06 | (2006.01) |
| H05K 7/20 | (2006.01) |
| B66D 1/60 | (2006.01) |
| H05K 7/14 | (2006.01) |
| B66D 1/56 | (2006.01) |
| B66D 1/36 | (2006.01) |
| B64F 3/02 | (2006.01) |
| H04W 84/04 | (2009.01) |

(52) U.S. Cl.
CPC ............... *B66D 1/36* (2013.01); *B66D 1/56* (2013.01); *B66D 1/60* (2013.01); *H02G 11/02* (2013.01); *H02J 9/061* (2013.01); *H05K 7/1427* (2013.01); *H05K 7/209* (2013.01); *B64U 2201/202* (2023.01); *H04W 84/042* (2013.01)

(58) Field of Classification Search
CPC ....... B64C 2201/122; B64F 3/02; B66D 1/36; B66D 1/56; B66D 1/60; H02G 11/02; H02J 9/061; H02J 2310/44; H05K 7/1427; H05K 7/209; H04W 84/042

See application file for complete search history.

(56) References Cited

U.S. PATENT DOCUMENTS

| | | |
|---|---|---|
| 6,241,063 B1 | 6/2001 | Van Ess et al. |
| 9,290,269 B2 | 3/2016 | Walker et al. |
| 9,446,858 B2 | 9/2016 | Hess |
| 2004/0137803 A1* | 7/2004 | Pitzele .................. H05K 3/368 |
| | | 439/884 |
| 2008/0123312 A1* | 5/2008 | Cheng .................. H02M 3/003 |
| | | 361/790 |
| 2011/0180667 A1 | 7/2011 | O'Brien et al. |
| 2017/0144754 A1* | 5/2017 | Limvorapun ........... B60L 50/72 |
| 2017/0181330 A1* | 6/2017 | Tang ..................... B64C 39/024 |
| 2017/0259941 A1 | 9/2017 | Briggs, IV et al. |

FOREIGN PATENT DOCUMENTS

| | | |
|---|---|---|
| WO | 2017165854 A2 | 9/2017 |
| WO | 2018/023031 A2 | 2/2018 |
| WO | 2018023031 A2 | 2/2018 |

OTHER PUBLICATIONS

Written Opinion dated Jul. 9, 2019. Applicant: Unmanned Systems and Solutions, LLC, PCT application No. PCT/US19/22318 filed on Mar. 14, 2019.

* cited by examiner

UNMANNED AERIAL VEHICLE TETHER SYSTEM

REFERENCE TO RELATED APPLICATION

This application is a continuation of, and claims priority to, U.S. Provisional Application No. 62/643,720 filed on Mar. 14, 2018, the entirety of which is incorporated herein by reference.

TECHNICAL FIELD AND BACKGROUND

The present invention relates generally to power and data delivery systems for tethered unmanned aerial vehicles ("UAVs").

UAV systems have become increasingly popular for use in applications such as surveillance or communication hubs for wireless networks. Conventional UAVs are untethered and operate under battery power, which limits possible flight times owing to significant energy demands imposed by the UAV's propulsion system and by other electronics installed on the UAV, such as cameras or communication equipment (i.e., the "payload"). Additionally, untethered UAVs communicate with ground systems using wireless signals that are generally considered less secure and that have less bandwidth than physical connections. Tethered systems overcome these disadvantages by providing a physical connection to a ground station for the continuous transmission of power and data through a cable or "tether."

Tethered systems must be designed carefully to avoid excessive cable heating, minimize the load that the weight of the cable imposes on the UAV propulsion system, and ensure that the cable can be reliably deployed and stowed without physically damaging the cable. The power demand for UAV systems and accompanying payloads can be substantial. The power demand increases with the use of longer cables that enhance the aerial range of the UAV because longer cables have increased resistance and a larger voltage drop across the length of the cable. Larger power demands result in increased cable heating and higher cable temperatures, which risks damage to the cable and UAV.

Cable heating is exacerbated in traditional tethered systems where the cable is stowed by spooling it in a layered fashion that impedes heat dissipation. Cable heating can be controlled in part through the use of separate refrigeration systems that cool the cable, but such refrigeration systems are costly, bulky, and add significant weight to the system. Cable heating can be reduced through the use of larger diameter cables that have less resistance and a smaller voltage drop. But larger diameter cables can impose a significant weight load on the UAV and are more difficult to spool and stow without damaging the cable. It would, therefore, be advantageous to provide UAV tether systems that achieve high-bandwidth data and high-power transmission over smaller diameter cables while avoiding excessive cable heating and allowing for convenient, reliable cable stowing without the use of a separate refrigeration system to cool the cable.

Accordingly, it is an object of the present invention to provide UAV tether systems that reliably deploy and retract cables capable of high-power and high-bandwidth data transmission and that spool cables in a single layer to promote heat dissipation thereby allowing the use of lower-diameter cables and obviating the need for an expensive, bulky refrigeration system to cool the cable. It is a further object of the present invention to provide a lightweight converter that can be utilized in UAV tether systems to achieve high-voltage power transmission across the cable to facilitate high-power inputs to a UAV and accompanying payloads without the use of high-current levels that lead to excessive cable heating in smaller cable sizes. Yet another object of the invention is to provide a converter system that can be used in a UAV tether system to provide a high-power input and a multitude of lower-voltage outputs that are suitable for powering a UAV and accompanying payloads that have varying voltage input requirements.

SUMMARY

A UAV tether system is provided that includes an elongated drum having a first end, a second end opposite the first end, an interior cavity, a first axis extending between the first end and the second end, and a sidewall having an exterior surface and a sidewall length extending between the first end and the second end, as well as threads disposed on the exterior surface at least partially along the sidewall length. The threads on the drum are sized to accommodate a cable seated within the threads. The cable not only functions as a tether that mechanically couples the UAV to the drum, but the cable also serves a medium for supplying power to the UAV and for facilitating two-way data communication between the UAV and a ground station. The drum also includes a first aperture sized to accommodate the cable where the aperture is disposed on the exterior surface of the drum. The drum also includes a second aperture in one end of the drum. A slip ring is secured within the second aperture. The slip ring is made with a housing configured to rotate within the drum and an insert that is sized to secure the cable within the insert. The insert is configured to rotate independent from the housing using bearings, for example, so that the cable can be secured to the drum but avoid twisting as the drum rotates. A drum motor is mechanically coupled to the drum and configured to rotate the drum when the motor is actuated.

The tether system also includes a head unit support member extending along the first axis at least partially along the sidewall length. A head unit is disposed about the head unit support member and operates to apply tension to the cable while deploying the cable off the drum threads or spooling the cable onto the drum threads. The head unit translates along the first axis and includes a spooling wheel that frictionally engages the threads and that is configured to rotate when the drum rotates, thereby translating the head unit along the first axis. The head unit also includes a head unit motor, a tension wheel mechanically coupled to the head unit motor, and a cable feeder having a passage sized to accommodate the cable. The cable extends from the slip ring through the drum cavity and through the first aperture to frictionally engage the tension wheel, and the cable extends through the cable feeder passage. When the head unit motor is engaged, the tension wheel rotates and applies a tension to the cable as the cable deploys off the drum threads or retracts to spool onto the drum threads.

In one embodiment, the tether system is secured within a drum housing that allows the drum to rotate within the housing. The housing may include additional features, such as a control input for deploying or spooling the cable, one or more data ports in signal communication with the cable, or a controller computing device in signal communication with UAV through the cable. The UAV can include electronic equipment such as antennae, transceivers, or various computing devices for facilitating cellular telephone service communication.

In another embodiment, the drum secured using a transverse support member, such as a plate, beam, or other suitable structure at one end of the drum, and an axel that extends through the drum and is secured to the transverse support member. In this manner, the drum can be secured so that it does not "wobble" yet remains free to rotate during spooling or deployment of the cable. In other embodiments, the drum can be secured with longitudinal support members that extend along the first axis and that frictionally engage the drum to hold it in place. The longitudinal support members themselves may be held in place by being secured to transverse support members at one or both ends of the drum. The longitudinal support members can also include rollers that frictionally engage the drum and that are configured to rotate as the drum rotates to further allow securing of the drum while permitting free rotation of the drum.

The drum can be mechanically coupled to the drum motor through, for instance, a circuit pulley wheel and a belt where the belt is driven by the drum motor to rotate the pulley that in turn rotates the drum. In other embodiments, the drum is coupled to the drum motor in a similar fashion but using a sprocketed gear and a chain.

In one aspect of the invention, the system includes a power supply coupled to the cable where the power supply includes one or more converter units. A first converter unit embodiment includes a first printed circuit board and a second printed circuit board with multiple internal conductor layers. The two circuit boards are coupled together using pins, or support elements that can be thermally and/or electrically conductive. The support elements have a first engagement end secured to the first printed circuit board, a second engagement secured to the second printed circuit board, and a length that defines a ventilation space between the two circuit boards. A first converter module is mechanically and electrically coupled to the second printed circuit board, and a plurality of heat sinks can be in thermal contact with the converter module. The heat sink fins can be mounted in any suitable location, including directly on the converter module or extending from a top or bottom surface of the second printed circuit board.

The power supply can include a second converter unit having a third printed circuit board, a fourth printed circuit board having multiple conductor layers internal to the printed circuit board, a support element that extends between and is secured to both printed circuit boards. The support member has a length so as to define a ventilation space between the printed circuit boards, and the second support element can likewise be electrically and/or thermally conductive. A second converter module is mechanically and electrically coupled to the second printed circuit board. The second converter unit also includes a plurality of heat sink fins in thermal communication with the converter module and mounted in any suitable location, such as directly to the converter module or to top and bottom surfaces of the second printed circuit board. The first and second converter units can both be housed within a single power supply housing.

In one embodiment, the printed circuit boards include eight or more conductor layers to assist with better heat dispersion. In another embodiment, a blower or other means for supplying forced air is provided that blows across the converter units, including through the ventilation spaces, to enhance heat dissipation. The converter modules themselves can be DC-to-DC converter modules configured to receive a high input DC voltage and convert the signal to a lower output DC voltage that is more suitable for use by various electronic equipment while still preserving the same power input.

In one aspect of the invention, the power supply module includes a plurality of converter modules connected in series where each converter module has an output connection point that increases by a predetermined amount across each converter module (e.g., 12V, to 24V, to 48V, to 60V, etc.). In this manner, the output voltage of the power supply can be variable to accommodate a range of payloads. One embodiment in particular includes a first voltage output connection point (e.g., 60V) and a second voltage output connection point having a lower voltage than the first voltage output connection point (e.g., 0V or ground or 12V, etc.).

The power supply can include first transistor with a first terminal electrically coupled to the first voltage output connection point and a second terminal. The power supply further includes a second transistor comprising a third terminal electrically coupled to the second voltage output connection point and a fourth terminal. The transistors function as a switch that only permit current flow when a voltage is applied to turn the transistors to an "on" state. The third and fourth transistor terminals can be connected to a load, such as the UAV, to which power is supplied. Some embodiments can include a battery backup system in parallel between the transistors and the load. The battery backup can include a battery having a positive terminal electrically coupled to the transistor second terminal through a first diode and negative terminal electrically coupled to the fourth terminal through a second diode. The diodes effectively isolate the battery backup system so that it is not constantly charging and to avoid overheating that might occur in the main power supply circuit.

BRIEF DESCRIPTION OF THE DRAWINGS

Features, aspects, and advantages of the present invention are better understood when the following detailed description of the invention is read with reference to the accompanying drawings, in which.

DETAILED DESCRIPTION

Figure 1:
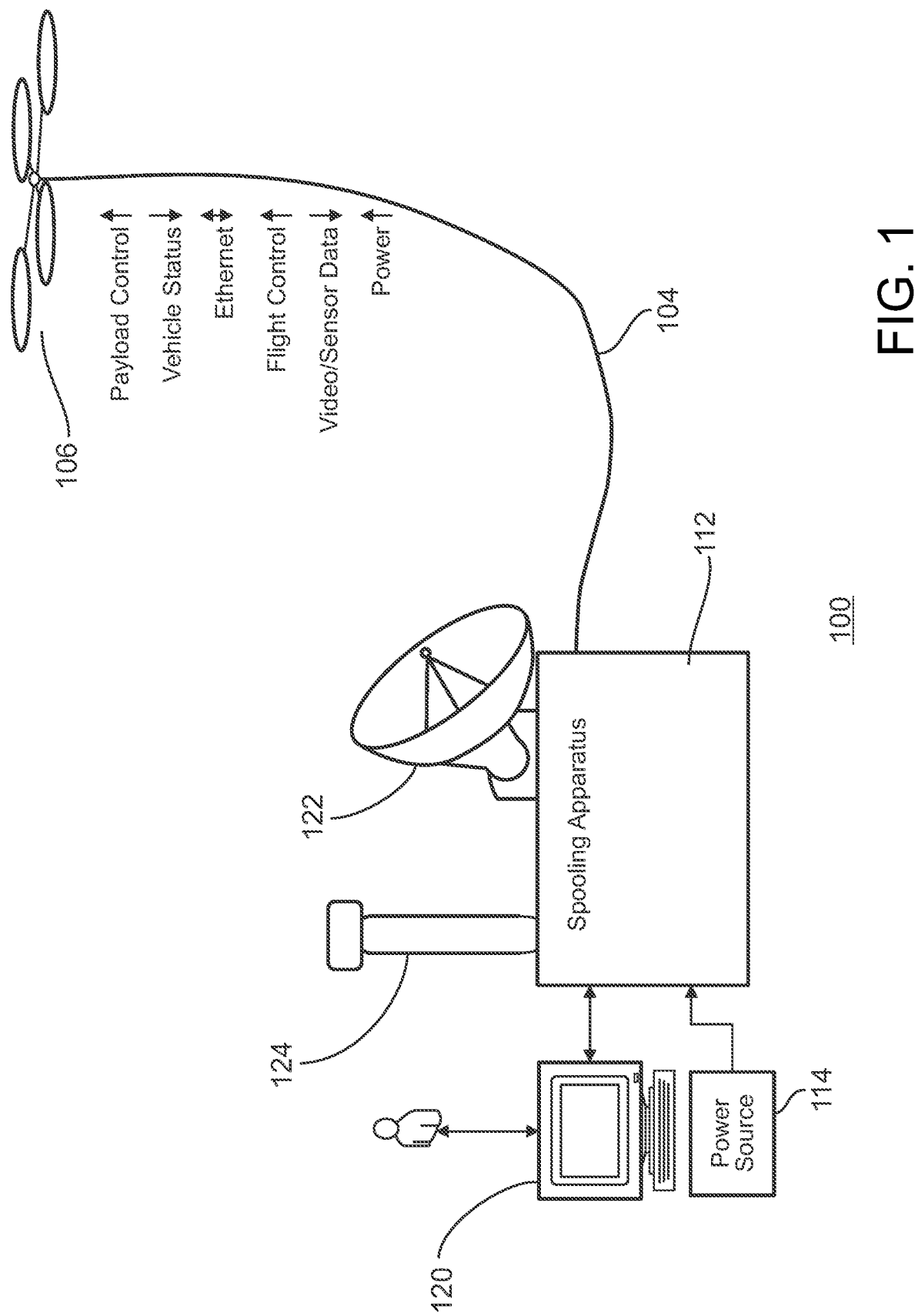
FIG. 1 is a diagram that illustrates an exemplary configuration for a tethered UAV system.

The present invention will now be described more fully hereinafter with reference to the accompanying figures in which exemplary embodiments of the invention are shown. However, the invention may be embodied in many different forms and should not be construed as limited to the representative embodiments set forth herein. The exemplary embodiments are provided so that this disclosure will be both thorough and complete and will fully convey the scope of the invention and enable one of ordinary skill in the art to make, use, and practice the invention.

Relative terms such as lower or bottom; upper or top; upward, outward, or downward; forward or backward; and vertical or horizontal may be used herein to describe one element's relationship to another element illustrated in the figures. It will be understood that relative terms are intended to encompass different orientations in addition to the orientation depicted in the drawings. By way of example, if a component in the drawings is turned over, elements described as being on the "bottom" of the other elements would then be oriented on "top" of the other elements. Relative terminology, such as "substantially" or "about," describe the specified materials, steps, parameters, or ranges as well as those that do not materially affect the basic and novel characteristics of the claimed inventions as whole (as would be appreciated by one of ordinary skill in the art).

Disclosed herein are power and data transmission systems configured for use with deployable and stowable cabling that achieve high-power and a high-data rate transmission using cables having a smaller diameter than the diameter of cables used in conventional systems. The exemplary embodiments disclosed herein are described with reference to the transmission of power to UAVs and providing two-way data communication with UAVs. But those of skill in the art will appreciate that the described systems can be applied to the delivery through cabling of power and data to various loads and devices other than UAVs particularly where it is advantageous to improve heat dissipation or provide a mechanism for deploying and stowing the cabling.

The system utilizes a head unit 340 that applies tension to the cable 104 and that moves synchronously with a drum motor 314 to spool and unspool cable 104 connected at one end to a UAV 106 onto a threaded drum 302. The heat unit 340 and drum 302 ensure that the cable 104 is spooled evenly, repeatably, and reliably in a single layer onto the drum 302 to promote heat dissipation in the cable 104 over systems that spool the cable 104 in layers and to mitigate against mechanical stress to the cable 104 through twisting, kinking, excessively tight spooling, or the like, which can occur in conventional systems. Mechanical stress or damage can result in excessive heating in metallic conductor cables and can lead to catastrophic failure in fiber optics cables, which are known to be delicate and susceptible to mechanical damage. The drum 302 is held securely in place to prevent translation or movement that could impede even and repeatable cable 104 spooling and unspooling. The cable is secured in a slip ring 326 that is installed along the axis of the drum 302 so that the slip ring 326 rotates freely with the drum 302 while the cable 104 does not, thereby further minimizing the mechanical stress applied to the cable 104 by twisting during drum 302 rotation and providing a substantial advantage over conventional tether systems that may twist, bend, or tangle cabling during spooling and unspooling.

The UAV tethered system disclosed herein further includes a first DC-to-DC converter on a ground station that steps up a 240V main power input and a second DC-to-DC converter power supply that can be mounted on a UAV 106 to step down the high-voltage input. The second converter transforms a high-voltage input into a multitude of lower-voltage outputs usable by the UAV 106 and accompanying electronic system payloads that may have varying voltage input requirements.

Allowing the use of a high-voltage input to the second converter allows the use of a high voltage across the cable 104, thereby reducing the current flowing across the cable 104 and in turn reducing the heat generated. The converter accepts a high-voltage input to a plurality of power modules 504, or DC-DC step down converters, placed in series. The use of multiple power modules in series 504 creates multiple voltage outputs that are stepped up at the output of each successive module 504 and that promotes heat dissipation by spreading the power conversion across multiple units 504 that can each be equipped with heat sinks 546.

The second step-down converter is lightweight and compact and constructed in a manner that promotes heat dissipation. The converter utilizes multi-layer printed circuit boards (540 & 544) ("PCBs") that can include, for example, eight conductor layers, where the conductors are more dispersed within the PCB (540 & 544) than conventional PCBs, which results in more effective heat dissipation. The converter additionally utilizes heat sinks 546 extending from the top and bottom surface of each power module 504, and utilizes separate power module PCBs 542 suspended above a main PCB 540 with heat sinks 546 extending into the cavity 548 between the main PCB 540 and the power module PCBs 544. Forced air can be run through the cavity 548 to further enhance heat dissipation.

An exemplary tethered UAV system 100 configuration is depicted in FIG. 1. The tethering system 100 can include a ground station having one or more of: (i) a cable spooling apparatus 112 for stowing and deploying the cable 104; (ii) a power supply 114 or step-up voltage converter; (iii) a ground station controller computing device 120; (iv) a circuit board that accepts and stores telemetry data from the UAV 106; (v) an integrated positioning system, such as a Global Positioning System ("GPS"); (vi) communication equipment such as a satellite dish 122, one or more antennae configured for cellular or radio communication, as well as associated transceivers and electronic equipment; and (vii) an optional boom extension 124 that can be used to support electronic equipment such as lights, antennae, or other communication equipment that can be utilized in addition to or in lieu of equipment mounted on the UAV 106 itself when the UAV 106 is not operating. The system 100 can further include one or more Wi-Fi, Ethernet, or fiber optic communication ports or hubs.

The ground station controller computing device 120 provides a user interface, such as a keypad, keyboard, or touch screen for communicating with and controlling the UAV 106. The controller computing device 120 can be used to carry out a variety of functions, including controlling the UAV 106 flight path, controlling the tethering system deployment and retraction, controlling communication, surveillance, or other equipment mounted on the UAV 106, or monitoring telemetry or other information coming from the UAV 106, such as position/location data, communication equipment usage, surveillance data (e.g., images coming from the UAV 106), or power usage data. Both the UAV 106 and the ground station can be equipped with a positioning system, such as GPS, that can further include enhanced real-time kinematic ("RTK") positioning that utilizes a known position for the ground station to provide error correction for the position of the UAV 106. The ground station can optionally include one or more wireless remote controllers such as the exemplary remote control 126 shown in FIG. 2 for wirelessly controlling UAV 106 flight and other equipment. The equipment can be ruggedized according to MTh Standards, for example, to help ensure robust operation in varying weather or other ambient conditions, such as rain, dust storms, or extreme heat or cold.

Figure 2:
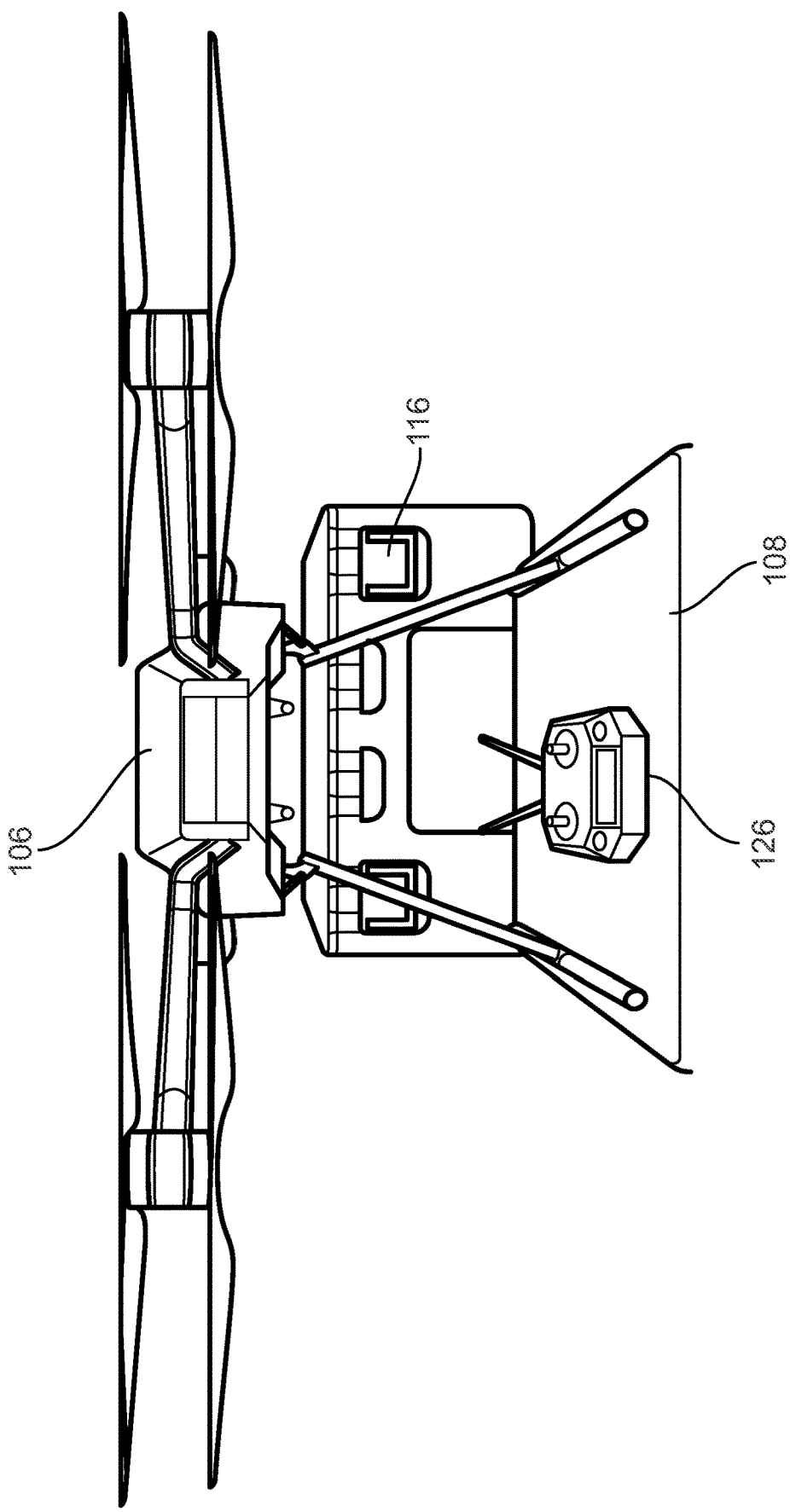
FIG. 2 illustrates a first commercial embodiment of a mobile tethered UAV system.
Figure 3:
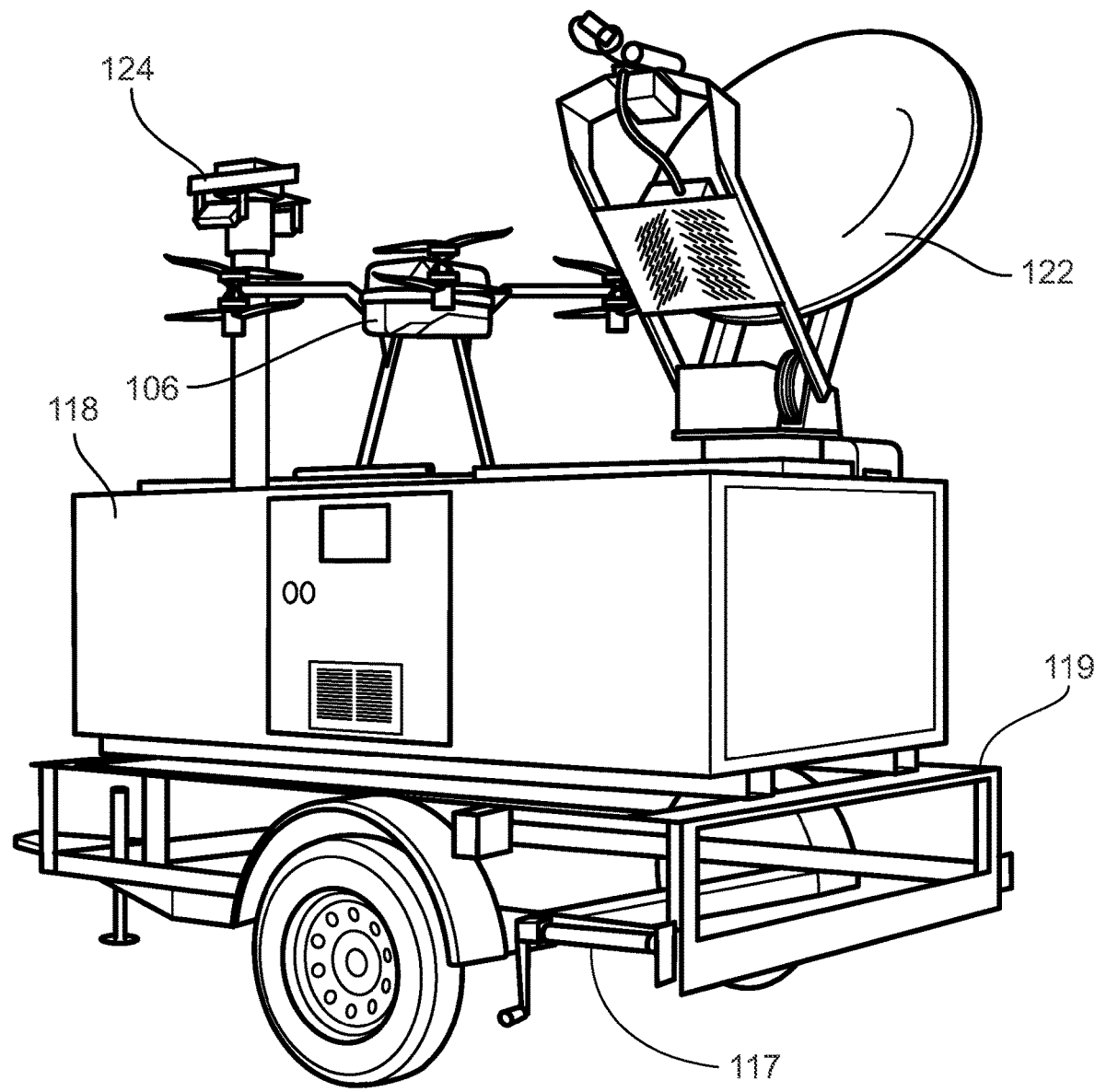
FIG. 3 illustrates a second commercial embodiment of a mobile tethered UAV system.

The system can have a multitude of configurations, including, for instance, the compact and mobile system show in FIG. 2 that can fit inside of a standard pickup truck or the higher power system shown in FIG. 3 that is configured to accommodate additional power generating equipment and to be towed on trailer 117. The portable system shown in FIG. 2 includes a ruggedized case 116 for holding the spooling equipment with exemplary dimensions of 43.65 inches in length, 27.9 inches in width, and 26.25 includes in height. The system can include a separate portable generator to operate as a power supply to the ground unit converter.

The higher-power embodiment depicted in FIG. 3 includes an off-road capable trailer 117, a vibration resistant equipment rack 119, additional storage space within the spooling housing 118, and exemplary dimensions of 48 inches in width, 96 inches in length, and 34 inches in height with an approximate weight of 3,300 pounds. The exemplary system shown in FIG. 3 includes an 11,250 Watt generator that can provide a 240V output for use by the UAV, an automatic generator start system, a 120V or 48V power rack for equipment, as well as an onboard 7,500 BTU (1,500 Watt) closed loop HVAC system. The boom extension 124 has a weight capacity of 90 pounds and can be extendable to varying heights. The communication equipment includes a 1 to 1.2 meter satellite dish capable of communicating on various satellite signal frequency bands, such as X, Ku, K, or Ka.

The UAV 106 power converter for the exemplary embodiments shown in FIGS. 2 and 3 can be configured to deliver 2.5 kilowatts or 5 kilowatts of power with an adjustable power output voltage having set points at 24V, 48V, or 60V to accommodate varying types of UAVs or other electronic devices. The converter can further include separate payload power delivery outputs of, for example, 12V, 24V, or 48V to deliver power to UAV 106 subsystems. The converter can have dimensions of approximately 13.5 inches in length, 6.5 inches width, 4.35 inches in height and a weight of about 6.4 pounds for a 5 kilowatt converter and only 4 pounds for a 2.5 kilowatt converter. The converter can also include power management electronics and data ports to provide telemetry data on converter power generation to the ground station controller computing device 120.

The ground station is connected to the UAV 106 via the cable 104. In one embodiment, the ground station is connected to the UAV 106 through approximately 450 ft. of cable 104. The UAV 106 shown in the attached figures includes 8 rotors with a payload capacity of 16 to 21 pounds. The UAV 106 can include various subsystems for surveillance, scanning, detection, communication, flight (e.g., ADS-B sense and avoid capabilities), location and positioning, and lighting, among others. Those of ordinary skill in the art will appreciate that the cable 104 can be used to deliver power to the UAV and facilitate two-way communication of data to other types of electronic devices and loads, including, for instance, another ground station.

Figure 4:
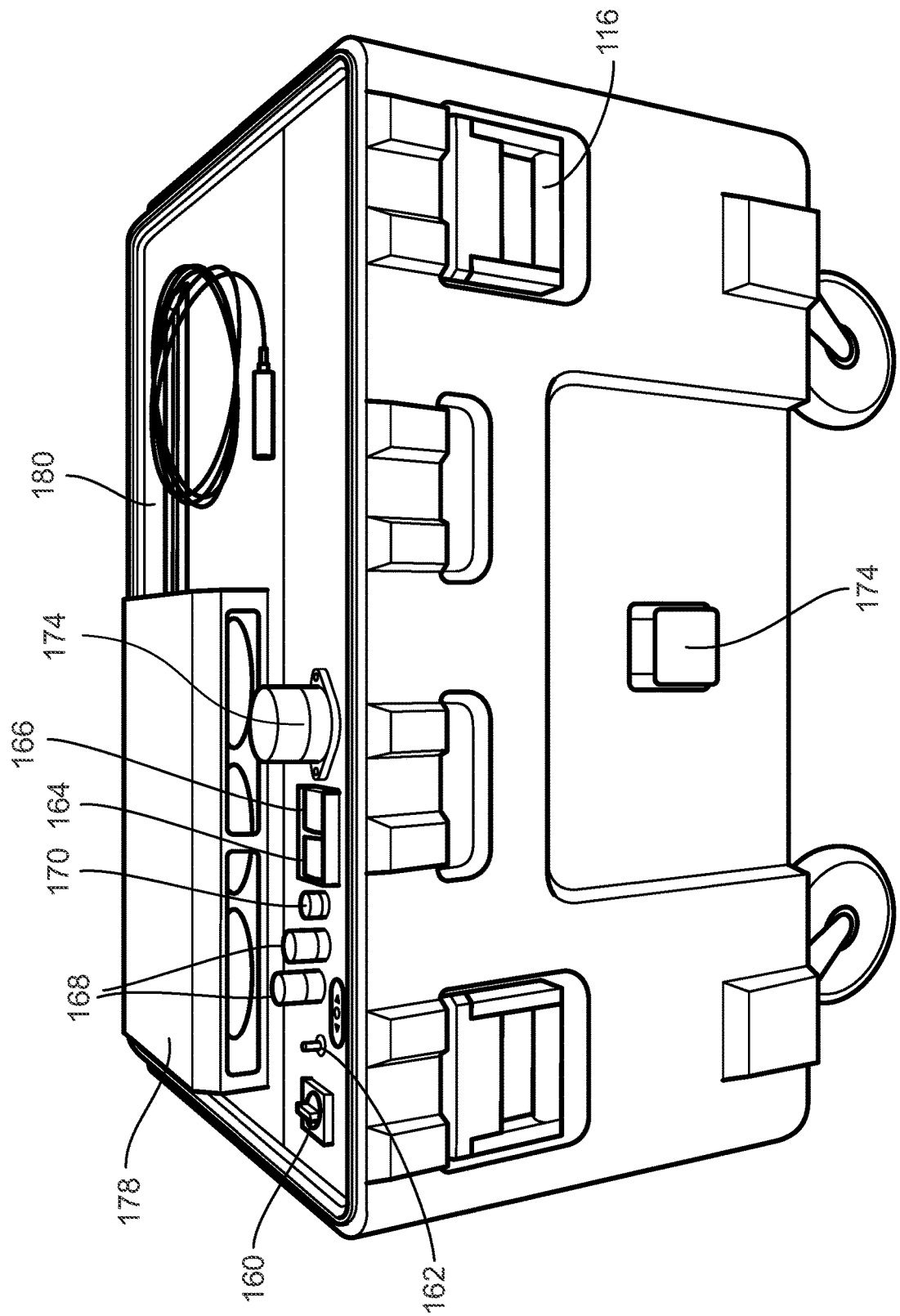
FIG. 4 is a top, perspective view of a rugged casing for a UAV ground station.
Figure 5:
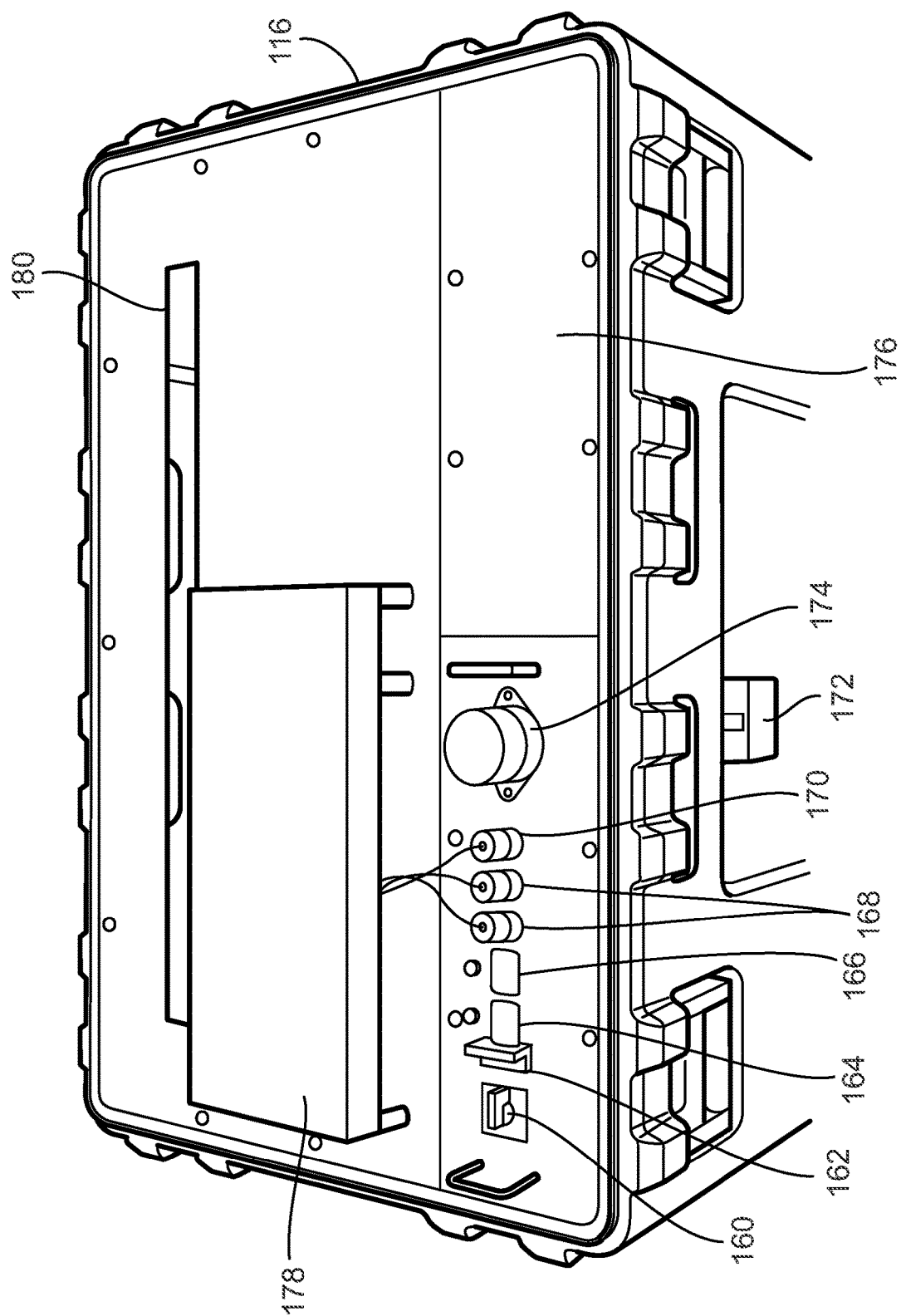
FIG. 5 is a top view of a rugged casing for a UAV ground station.

The cable spooling apparatus 112 can be housed within the portable, ruggedized case such as the case 116 shown in FIGS. 2, 4, and 5. The outside of the case 116 shown in FIGS. 4 and 5 provides various power and data ports and controls, that can include, for example: (1) a cable high-power on/off switch 160; (2) a cable control deployment and retraction switch 162; (3) a 120V breaker 164; (4) a 240V breaker 166; (5) one or more Ethernet ports 168; (6) a fiber optic port 170; (7) a 240V input power port 172; (8) a cable high-voltage, power-on indicator light 174; (9) a high-voltage rectifier bay 176; (10) a ventilation port 178; and (11) a cable bay 180 for deployment and stowing of the cable 104. Skilled artisans will recognize that these examples are not intended to be limiting, and other types of controls or ports can be provided, including, for instance, a touch-screen display or keypad.

Figure 6:
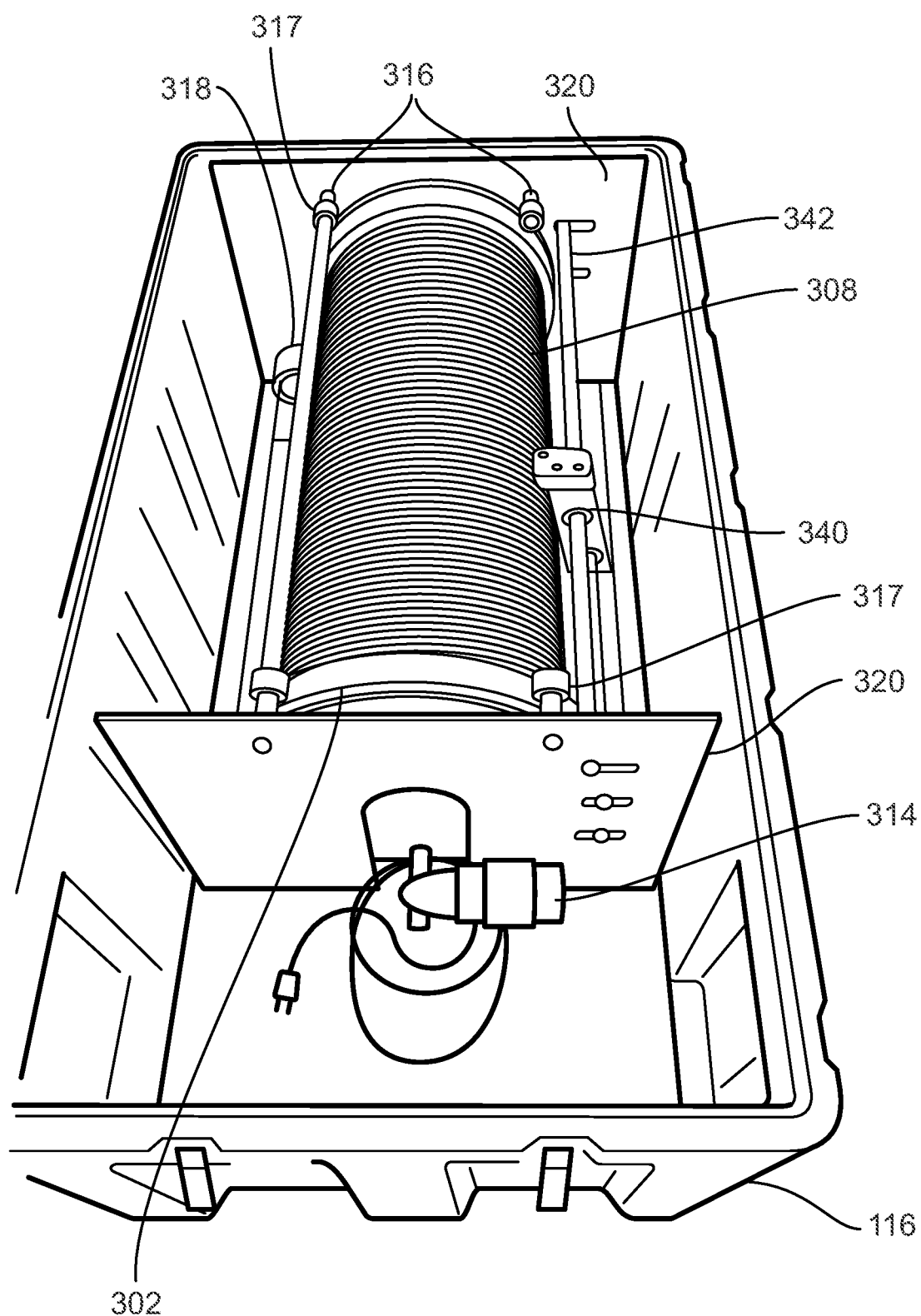
FIG. 6 is a top view of an embodiment of a UAV cable spooling apparatus.
Figure 7:
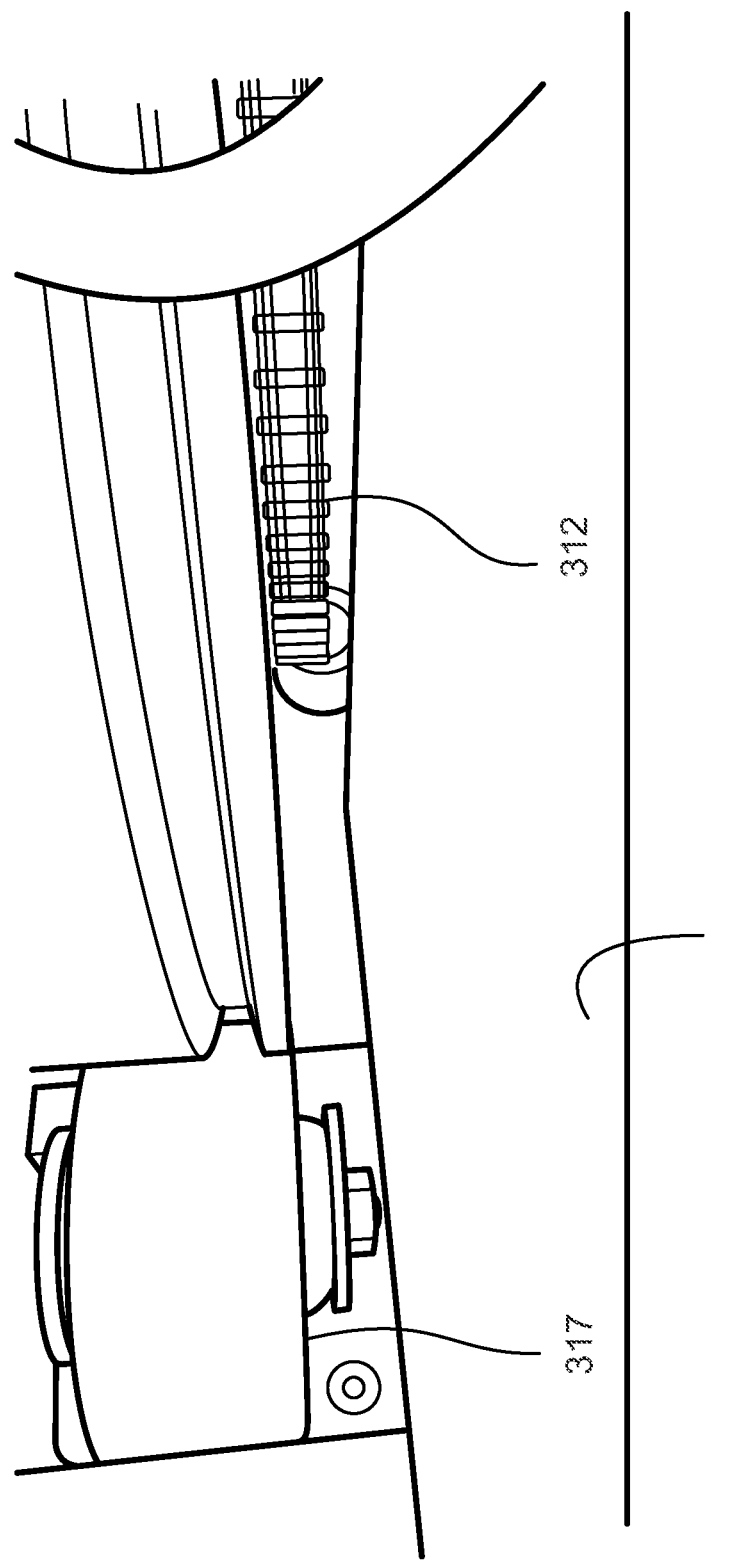
FIG. 7 illustrates a drum support member and drum chain that mechanically couples the drum to a drum motor.

Turning to FIG. 6, the cable spooling apparatus can include: (1) a drum 302 for spooling the cable 104 when retracted in the stowed position; (2) a drum motor 314 for rotating the drum 302; (3) one or more drum support rollers 318; (4) one or more drum support members 316; (5) one or more support plates 320 for mounting the drum support members 316; (6) a head unit 340 that facilitates retraction and deployment of the cable 104; and (7) a head unit support member 342 that facilitates translation of the head unit 340 across the length of the drum 302. The drum motor 314 is mechanically coupled to the drum through sprocketed gears and a chain 312, as depicted in FIG. 7.

While housed within the casing 116, the drum 302 rests on one or more drum support rollers 318 that support the weight of the drum 302 while permitting the drum 302 to rotate when the drum motor 314 is engaged. The drum 302 is further secured within the rugged casing 116 by one or more drum support members 316 that are affixed to support plates 320 at the first and second end of the drum. The drum support members 316 include support member rollers 317 that frictionally engage the drum 302 to hold it in place while still permitting the drum 302 to rotate when the drum motor 314 is engaged. The drum support members 316 can extend the entire distance between the support plates 320 or extend partially outward from only one of the support plates 320 to frictionally engage the drum 302 at a roller 317 position. The combination of the drum support rollers 318 and drum support members 316 ensures that the drum 302 does not "wobble" or translate in the radial direction while rotating, which could impede proper spooling or unspooling of the cable 104. Properly securing the drum 302 also permits the system to be safely and conveniently transported without the drum 302 becoming dislodged or repositioned.

Figure 8:
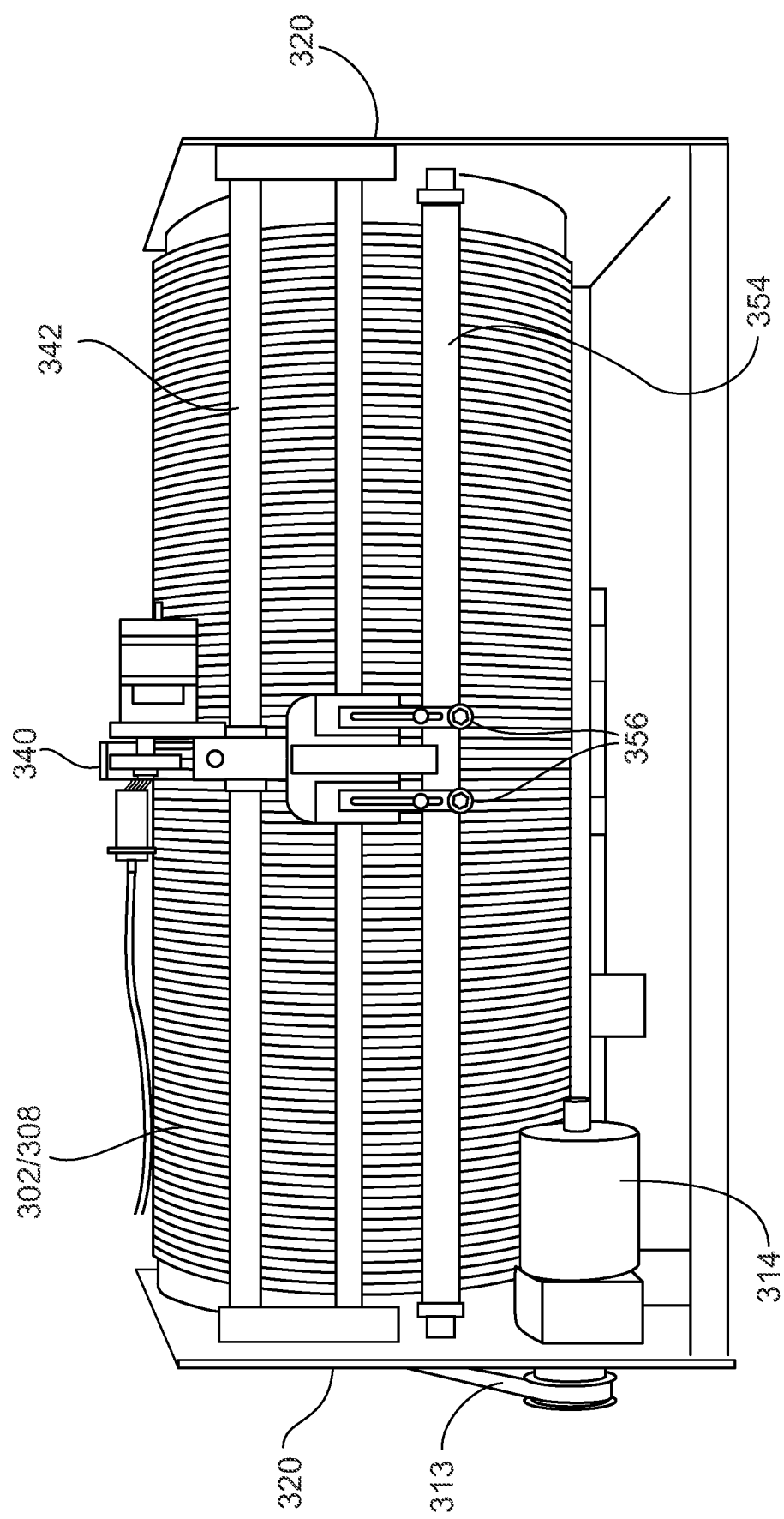
FIG. 8 is a side view of an embodiment of a UAV cable spooling apparatus.

In another embodiment shown in FIG. 8, the drum 302 is stably secured with an axel (not shown) extending through the center of the drum 302 between the support plates 320. The use of a rigid axel obviates the need for use of the drum support members 316, support member rollers 317, and drum support rollers 318. The embodiment shown in FIG. 8 further utilizes a belt 313 instead of a chain to couple the drum 302 axel to the drum motor 314.

Figure 9:
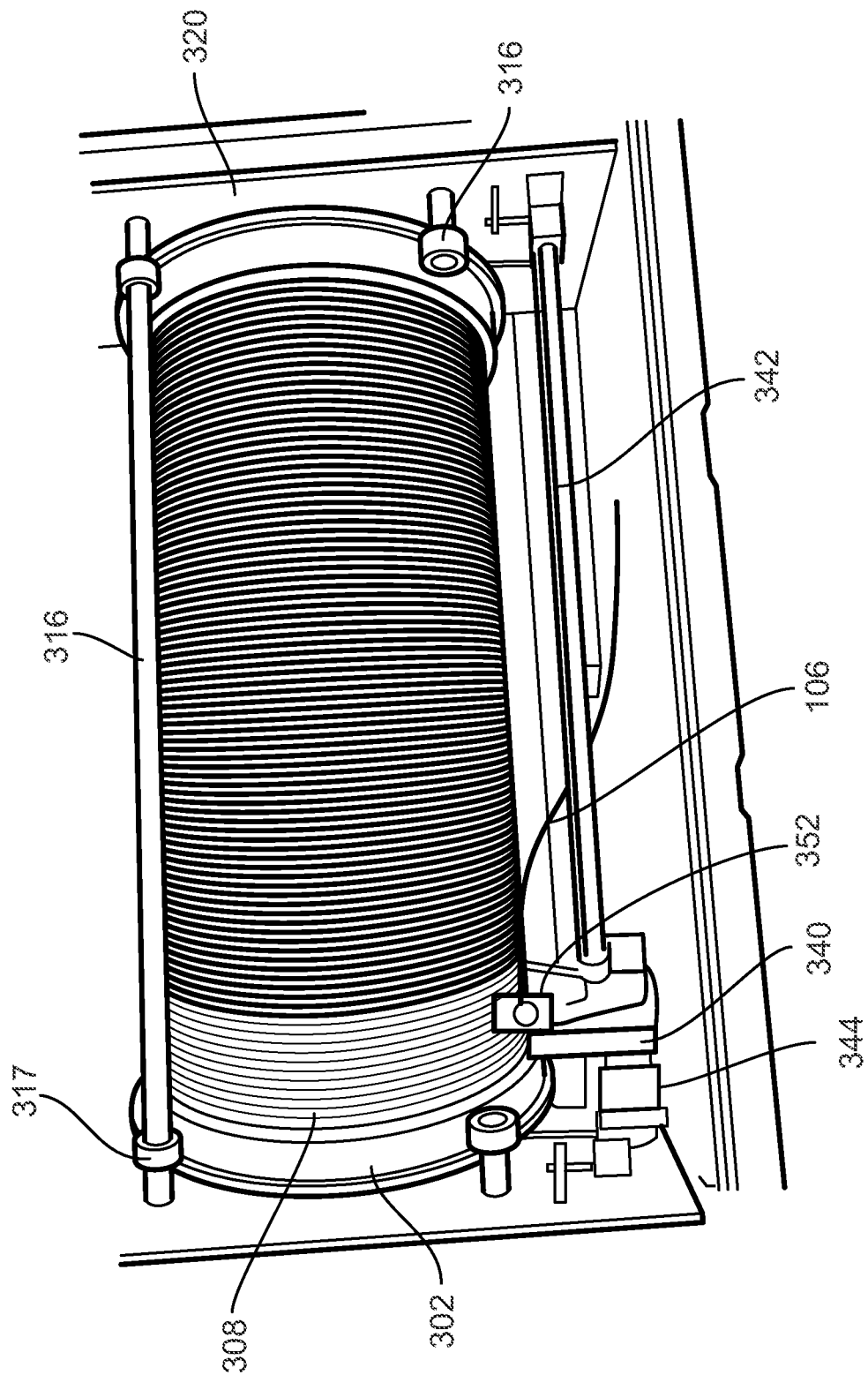
FIG. 9 is a top view of an exemplary head unit and UAV cable spooling apparatus.
Figure 10:
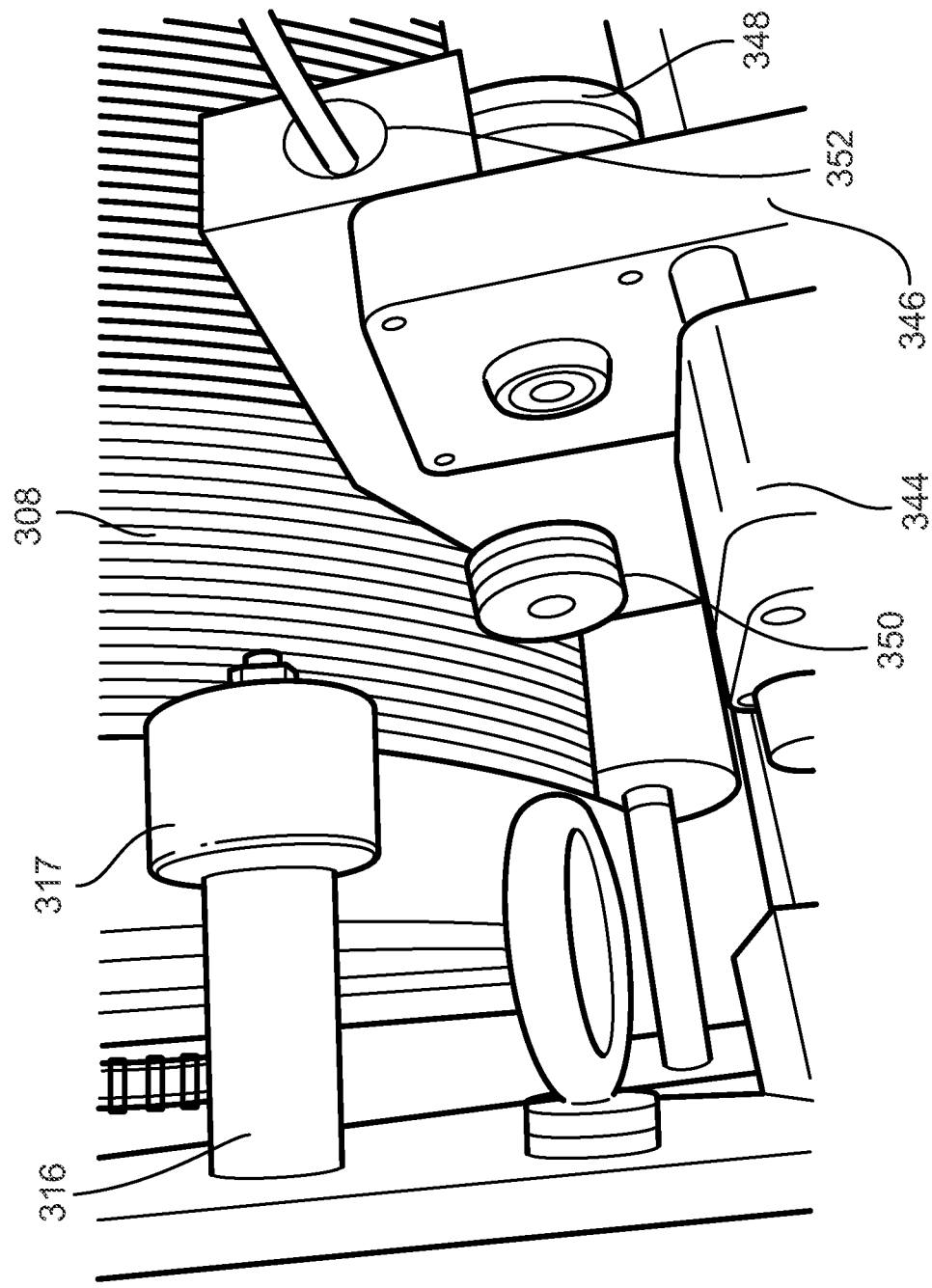
FIG. 10 is a top, perspective view of an exemplary head unit for a UAV cable spooling apparatus.

Details of the head unit 340 are shown in FIGS. 9 and 10. The head unit 340 facilitates deployment and retraction of the cable 104 and includes a head unit motor 344, a gear box 346, a cable feeder guide 352, and a spooling wheel 350. The outside surface of the drum 302 is threaded 308, and the threads 308 and cable 104 are sized such that the cable 104 becomes seated within the drum threads 308 as the cable 104 is spooled. The cable 104 coming off the drum 302 engages the tension wheel 348 and is fed through the cable feeder 352. The tension wheel 348 is mechanically coupled to the head unit motor 344 through the gear box 346.

Figure 11:
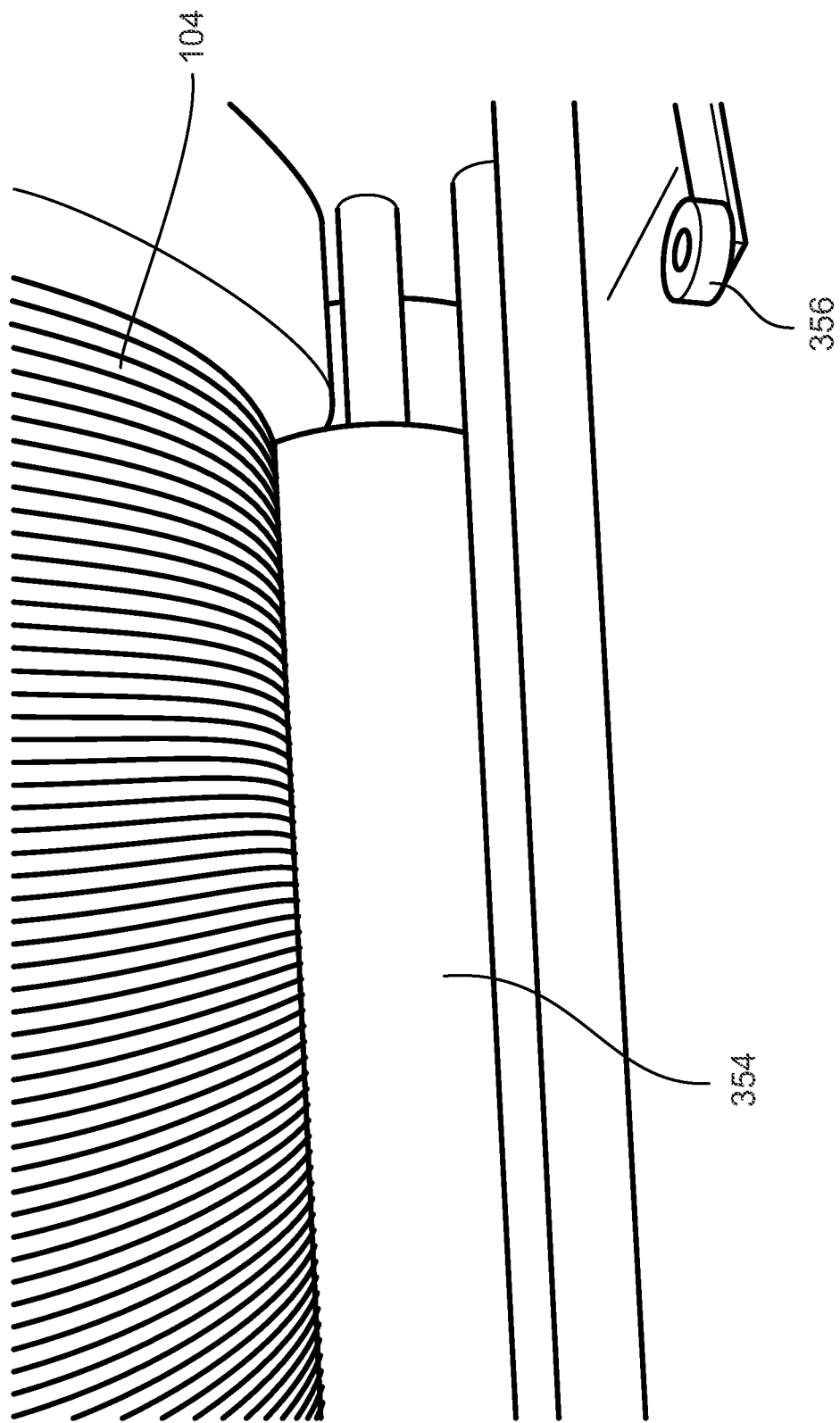
FIG. 11 is a top view of a cable securing member.

During deployment or retraction of the cable, the head unit motor 344 rotates which in turn rotates the tension wheel 348 and applies tension to the cable 104 as it is fed off of the drum 302 or spooled onto the drum 302. In essence, the cable is "pulled" off the drum 302 by the head unit 340 during deployment, and tension is likewise maintained as the cable 104 is spooled. Applying tension to the cable 104 and running the cable 104 through the cable feeder 352 ensures that the cable 104 does not become too loose, thereby ensuring the cable 104 spools evenly onto the drum 302 to become properly seated within the threads 308. This is a significant advantage over conventional systems where the cable may become crisscrossed or layered as it is spooled onto the drum, which inhibits heat dissipation and risks physical damage to the cable. Further, permitting the head unit 340 to facilitate deployment of the cable 104 reduces the required load on the UAV 106 propulsion system that would otherwise be required to apply force to unspool the cable during flight. The cable 104 is further secured within the drum threads 308 by the cable securing member 354 shown in FIG. 11, which is configured as an elongated roller that frictionally engages the spooled cable 104 across the length of the drum 302 as the cable securing member 354 extends between the two support plates 320.

The head unit 340 is disposed about the head unit support member 342 and translates along the length of the head unit support 342 member when the drum motor 314 rotates. As shown in FIG. 10, the spooling wheel 350 frictionally engages the threads 308 such that when the drum 302 rotates, the spooling wheel 350 follows the threads 308, thereby translating the head unit 340 along the length of the head unit support member 342 in a manner that is synchronous with the rotation of the drum 302 and drum motor 314. This synchronous motion between the drum 302 rotation and head unit 340 translation facilitates even spooling of the cable 104 within the drum threads 308.

Figure 12:
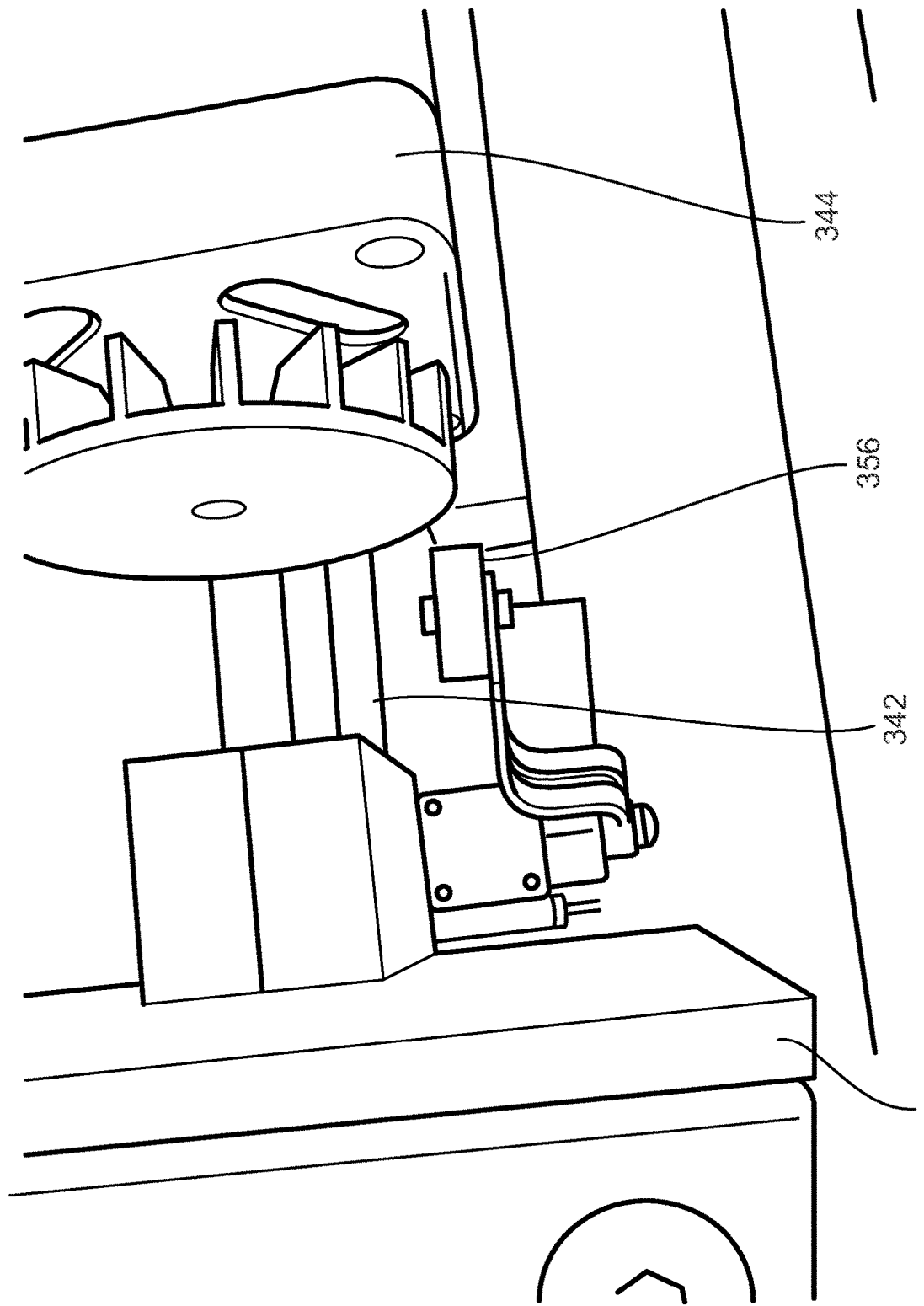
FIG. 12 is a top view of a limit switch and head unit.

The system includes a limit switch 356 at both ends of the head unit support member 342, as shown in FIGS. 8 and 12, that cuts power to the drum motor 314 when the head unit 340 translates far enough along the support member 342 to contact and rotate the limit switch 356 to the off position. The limit switches 356 can be mounted, for example, to the head unit itself 340 as shown in FIG. 8 or to the support plates 320 as shown in FIG. 12. Cutting power to the drum motor 314 not only stops the drum 302 from rotating but also stops the head unit 340 from further translating, thereby ensuring the cable 104 is spooled in a single layer only to the end of the drum 302. Spooling the cable 104 only in a single layer, as opposed to multiple layers as in conventional UAV tethering systems, ensures that heat dissipation from the cable 104 is not impeded. In this manner, the cable 104 is kept much cooler than in conventional systems, which permits use of a smaller diameter cable 104 in higher-power applications.

Figure 13:
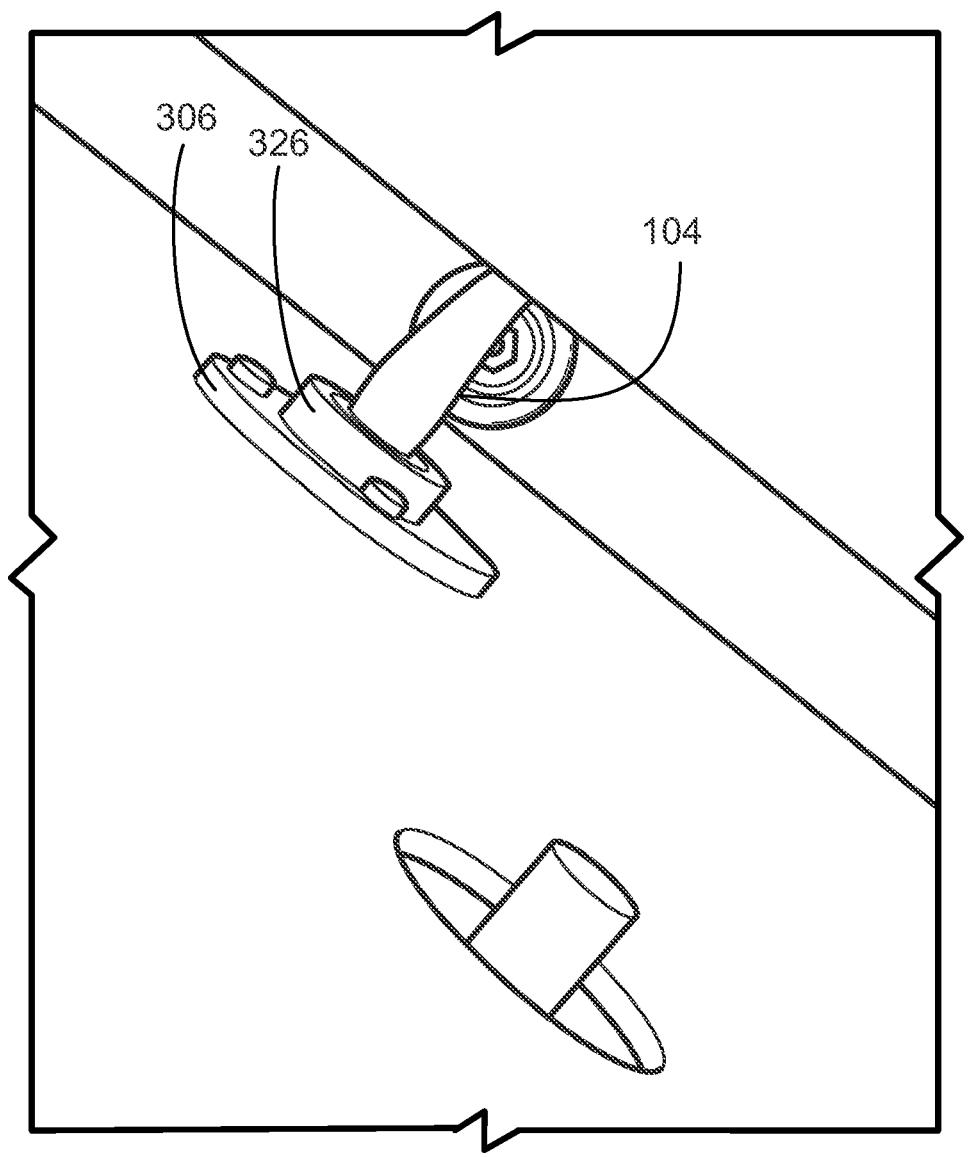
FIG. 13 illustrates a slip ring and cable installed in the drum.
Figure 14:
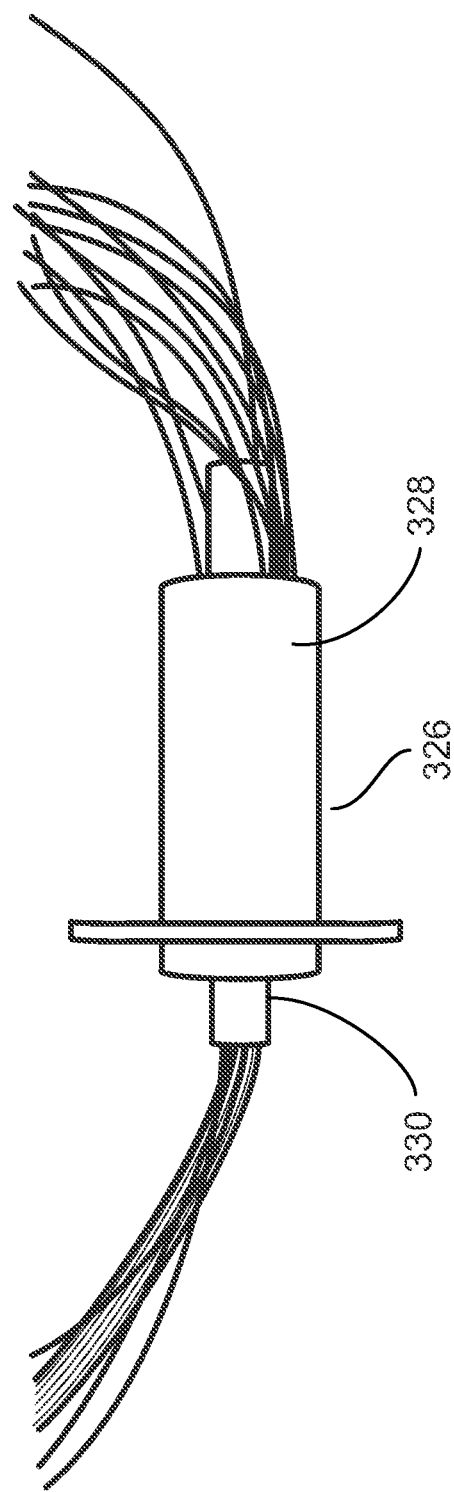
FIG. 14 illustrates a slip ring and cable prior to installation in a drum.
Figures 15A, 15B:
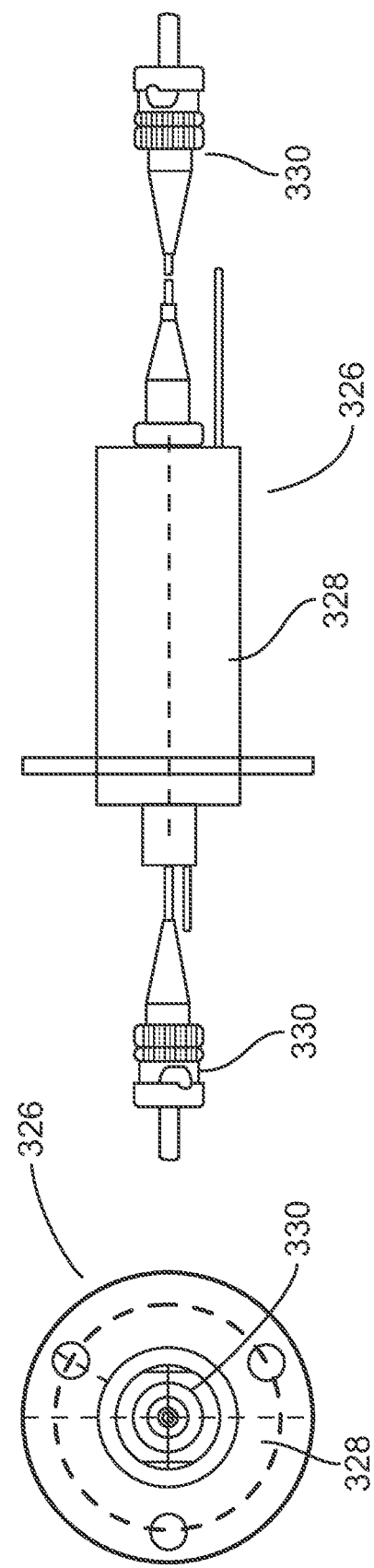
FIG. 15A is an end view of a slip ring.
FIG. 15B is a side view of a slip ring.

One end of the cable 104 connects to the UAV 106 while the second end extends through an aperture in the outside cylindrical surface of the drum 302. The second cable end runs through interior of the drum 302 and runs out a second aperture 306 in the axial center of the drum end through a slip ring connector 326, as shown in FIG. 13. The slip ring connector 326 is shown in more detail in FIGS. 14 and 15A-B. The slip ring 326 includes an insert 330 that houses the cable 104 and a bearing that permits the outer housing 328 of the slip ring 326 to rotate with the drum 302 while the insert 330 and cable 104 do not. Preventing rotation of the cable 104 mitigates or prevents against physical damage to the cable 104 that occurs in conventional systems where the cable 104 may twist, bend, or tangle as the drum 302 rotates during cable 104 deployment or retraction, thereby leading to potentially permanent, catastrophic damage that can be particularly acute for delicate cables, such as cables with fiber optic lines, rigid sheathing, thin metallic conductors, or the like.

The cable 104 shown in the attached figures is comprised of two wires for supplying power to the UAV (a live wire and a ground wire) as well as at least one fiber optic cable for data transmission. In one exemplary embodiment, the tether system utilizes 18 gauge, military specification wire (MIL-W-25038) made of nickel-plated copper with a polytetrafluoroethylene ("PTFE") insulating coating and having a voltage rating of up to 600V and a temperature rating of 260 degrees Celsius. The embodiment further includes one or more single or multi-mode OM3 fiber optic cables with a protective insulating coating. The power wires and fiber optic cable(s) are all encased within a thermally resistant, breathable sheath. The resulting cable 104 has a weight of approximately 1.8 lbs. per 100 feet of cable. In one embodiment, the cable 104 is configured to achieve greater than 1 gigabyte per second bidirectional data transfer rates.

The cable 104 runs from the cable spooling apparatus 112 to a lightweight power converter installed on the UAV 106 that converts a high voltage input from the cable into a plurality of lower voltage outputs. The UAV 106 and accompanying payload electronic systems may impose a substantial input power demand across the cable 104. To meet the demand, the UAV 106 tether system utilizes a high input voltage to the cable 104, which in turn reduces the current running through the cable 104. Lower currents reduce the amount of heat generated in the cable 104 during operation.

The UAV 106 and accompanying payload electronics utilize low voltage inputs. Thus, use of a converter has the advantage of permitting a high input voltage to the cable 104 that can be stepped down to appropriate voltage levels to feed power to the UAV 106 and payload electronics. Furthermore, configuring the converter to provide multiple output voltage levels allows the use of a single power transmission line within the cable 104 as opposed to multiple power transmission lines that would significantly increase the size of the cable and the resulting load on the UAV 106 propulsion system.

Figure 16:
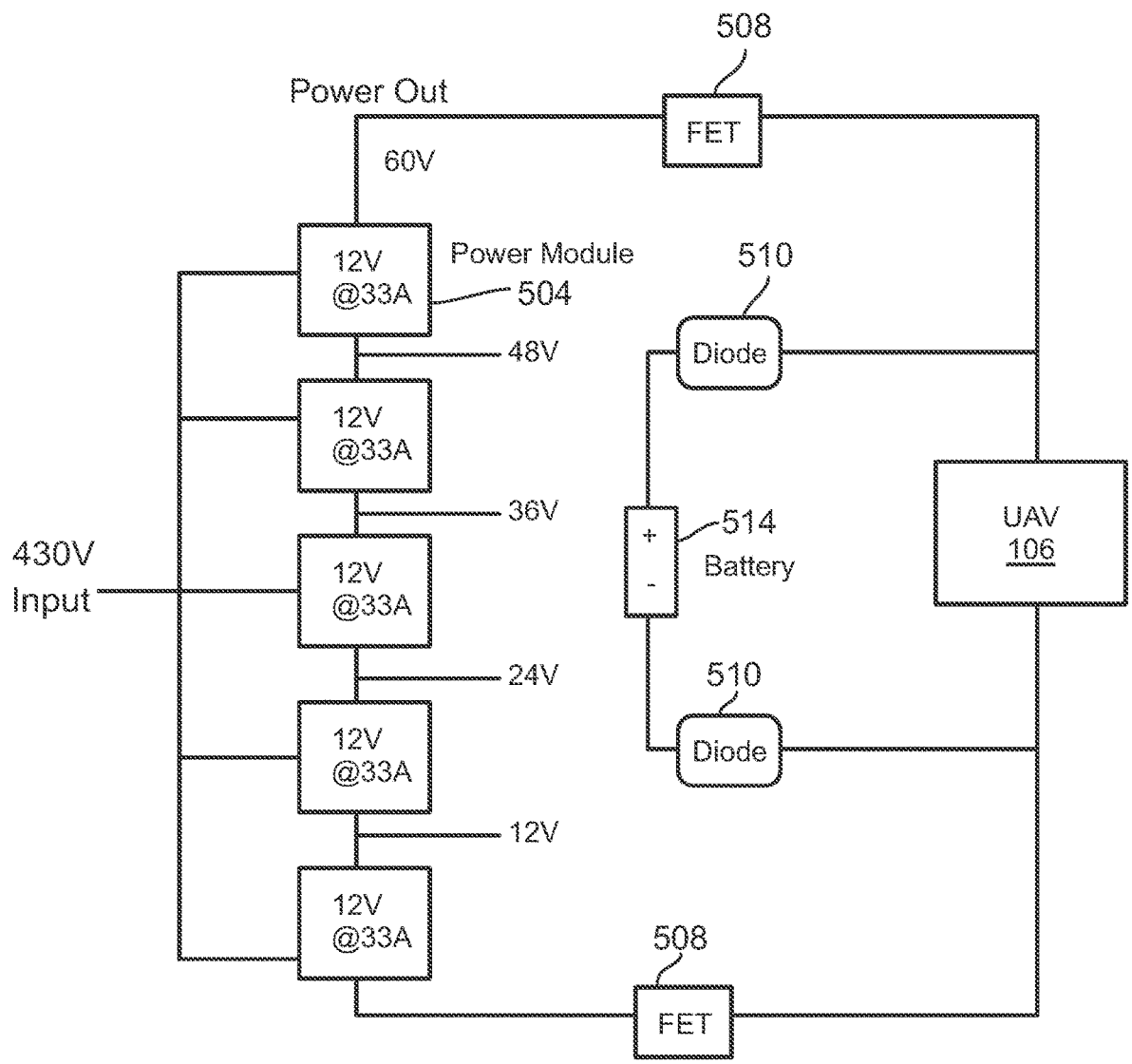
FIG. 16 is an exemplary converter circuit diagram.

An exemplary converter circuit configuration is shown in FIG. 16 and utilizes a single 430V input that is fed to five 12V DC-DC converters, or power modules 504, at 33 amperes that are arranged in series with a final output of 60V at over 160 amperes. Those of ordinary skill in the art will appreciate that the converter circuit can accommodate a range of input values, such a 120V input, 240V input, or any suitable voltage value that provides sufficient power to the UAV while reducing the current transmission across the cable 104 to avoid excessive heating. The series arrangement of multiple power modules 504 results in a sequence of incrementally stepped up voltage lines (e.g., 12V, 24V, 36V, etc.) that can be used to feed different types of UAVs or different types of payload electronic systems on the UAV 106 that may have varying input power requirements. The 60V output from the last power module 504 is fed to the UAV 106 through a field effect transistor 508 ("FET"). The FET 508 is switched to "on" when the 60V line is active. If power is removed from the 60V line, the FET 508 is switched to "off" so that the battery backup 514 can seamlessly be supplying power to the UAV 106.

The battery backup circuit is arranged in parallel with the main power system rather than in series where the battery 514 would be in a constant charging state while main power is active. In this manner, the battery backup is isolated from the main power to avoid unnecessary stress on the battery 514 that could cause overheating and potentially become a fire hazard. The battery power runs through two "OR" diodes 510 that have a limited current capacity and that are designed to burn out and break the line in the event of a current spike. The diodes 510 further isolate the battery 514 and ensure that unnecessary stress is not applied to the battery.

Skilled artisans will recognize that the converter circuit configuration shown in FIG. 16 is not intended to be limiting, and a varying number of power modules 504 with different voltage levels may be utilized. For instance, in one embodiment, the 430V input is also fed into a second circuit configuration that includes two 24V power modules in series with a 12V power module to provide 24V, 48V, and 60V outputs. In this manner, the output voltages are customizable depending on the power requirements for the UAV 106 and the accompanying payload electronics.

Figure 17:
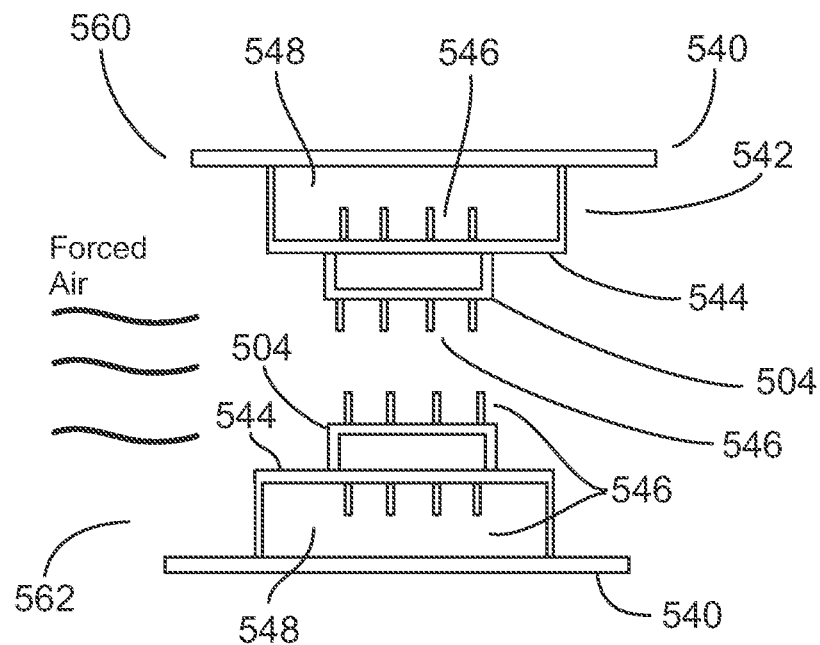
FIG. 17 illustrates an exemplary configuration for converter construction.

Construction of the converter unit is illustrated in FIG. 17 and comprises a top unit 560 and a bottom unit 562 that are enclosed within converter housing (not shown). Each converter unit (560 & 562) includes: (1) a main PCB 540; (2) a power module PCB 544 mounted to the main PCB 540 by a plurality of support pins 542; (3) a plurality of power modules 504 mounted on the power module PCBs 544; and (4) heat sink fins 546 affixed to the top and bottom surfaces of each power module 504. The main PCB 540 and the power module PCBs 544 both have eight conductor layers, which results in improved heat dissipation over PCBs with fewer layers. Those of ordinary skill in the art will appreciate that more or less conducting layers can be utilized while still achieving the desired heat dissipation effect but that generally speaking utilizing more layers than conventional PCBs can improve performance. Mounting the power module PCB 544 on the main PCB with support pins 542 creates additional ventilation space 548 between the two PCBs (540 & 544) for both the top 560 and bottom 562 units. A layer of heat sink fins 546 extends into the ventilation space. A fan affixed to the converter housing runs forced air over the top and bottom converter units to enhance heat dissipation.

Figure 18:
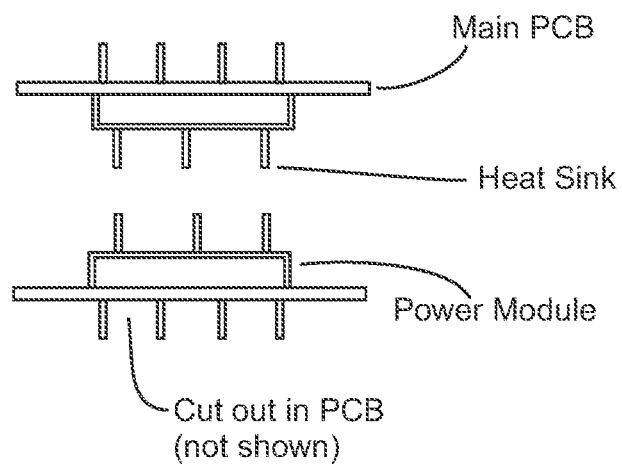
FIG. 18 illustrates an exemplary configuration for converter construction.

With regard to heat dissipation, the converter construction disclosure herein represents a significant improvement over prior systems, such as the configuration shown in FIG. 18, that utilize a single, four-layer PCB for each converter unit. In a single PCB construction, the PCB must include a cutout to accommodate the bottom layer of heat sink fins extending from the power module. The bottom layer of heat sink fins would, therefore, not be exposed to forced air when the converter units are enclosed within a housing. And the use of a single PCB results in a higher concentration of conductors, thereby further inhibiting heat dissipation over the configuration shown in FIG. 18.

Although the foregoing description provides embodiments of the invention by way of example, it is envisioned that other embodiments may perform similar functions and/or achieve similar results. Any and all such equivalent embodiments and examples are within the scope of the present invention.

What is claimed is:

1. A UAV tether system power supply comprising:
   a first converter unit comprising
      a first main printed circuit board,
      a first power module printed circuit board comprising a plurality of conductor layers,
      first support pin and a second support pin each having a first end coupled to the first main printed circuit board a second end coupled to the first power module printed circuit board and a first converter unit support pin length between the first end and the second end, wherein the first converter unit support pin length defines a first space between the first main printed circuit board and the first power module printed circuit board;
      a first converter module mechanically and electrically coupled to the first power module printed circuit board; and
   a second converter unit comprising
      a second main printed circuit board,
      a second power module printed circuit board comprising a plurality of conductor layers,
      third support pin and a fourth support pin each having a third end coupled to the second main printed circuit board, a fourth end coupled to the second power module printed circuit board, and a second converter unit support pin length between the third end and the fourth end, wherein the second converter unit support pin length defines a second space between the second main printed circuit board and the second power module printed circuit board, and
      a second converter module mechanically and electrically coupled to the second power module printed circuit board; and
   a housing configured to accommodate the first converter unit and the second converter unit, wherein
      the first converter unit and the second converter unit are at least partially enclosed within the housing unit and separated by third space, and
      the first converter unit and the second converter unit are arranged such that the second converter unit is a mirror image of the first converter unit about the third space.

2. The UAV tether system power supply of claim 1 wherein the first power module printed circuit board comprises eight or more conductive layers and the second power module printed circuit board comprises eight or more conductive layers.

3. The UAV tether system power supply of claim 1 wherein the first support pin, the second support pin, the third support pint, and the fourth support pin are each electrically and thermally conductive.

4. The UAV tether system power supply of claim 1 further comprising device that blows air across the first converter unit into the first space.

5. The UAV tether system power supply of claim 1 wherein the first converter module is a direct current to direct current module.

6. The UAV tether system power supply of claim 4 further comprising device that blows air across the second converter unit into the second space.

7. The UAV tether system power supply of claim 5 wherein the second converter module is a direct current to direct current module.

8. The UAV tether system power supply of claim 1 further comprising:
- a plurality of first converter unit converter modules mechanically and electrically coupled to the first power module printed circuit board, wherein the plurality of first converter unit converter modules
  - are connected in series,
  - each have a first voltage output connection point and a second voltage output connection point, and wherein
  - the second voltage output connection point has a lower voltage than the first voltage output connection point;
- a first transistor comprising
  - a first terminal electrically coupled to the first voltage output connection point, and
  - a second terminal;
- a second transistor comprising
  - a third terminal electrically coupled to the second voltage output connection point, and
  - a fourth terminal; and
- a first battery backup comprising
  - a positive terminal electrically coupled to the second terminal through a first diode, and
  - a negative terminal electrically coupled to the fourth terminal through the second diode.

9. The UAV tether system power supply of claim 8 further comprising:
- a plurality of second converter unit converter modules mechanically and electrically coupled to the second power module printed circuit board, wherein the plurality of second converter unit converter modules
  - are connected in series,
  - each have a third voltage output connection point and a fourth voltage output connection point, and wherein
  - the fourth voltage output connection point has a lower voltage than the third juhhhhvoltage output connection point;
- a third transistor comprising
  - a fifth terminal electrically coupled to the third voltage output connection point, and
  - a sixth terminal;
- a fourth transistor comprising
  - a seventh terminal electrically coupled to the fourth voltage output connection point, and
  - an eighth terminal;
- a second battery backup comprising
  - a positive terminal electrically coupled to the sixth terminal through a third diode, and
  - a negative terminal electrically coupled to the eighth terminal through the fourth diode.

* * * * *

UNITED STATES PATENT AND TRADEMARK OFFICE
CERTIFICATE OF CORRECTION

| | |
|---|---|
| PATENT NO. | : 11,772,791 B2 |
| APPLICATION NO. | : 16/353720 |
| DATED | : October 3, 2023 |
| INVENTOR(S) | : Chris Broberg et al. |

It is certified that error appears in the above-identified patent and that said Letters Patent is hereby corrected as shown below:

In the Claims

Column 14, Claim 9, Line 10 reads as:
the fourth voltage output connection point has a lower voltage than the third juhhhhvoltage output connection point;

It should read as:
the fourth voltage output connection point has a lower voltage than the third voltage output connection point;

Signed and Sealed this
Twenty-eighth Day of November, 2023

Katherine Kelly Vidal
*Director of the United States Patent and Trademark Office*